(12) United States Patent
Chen et al.

(10) Patent No.: US 7,180,767 B2
(45) Date of Patent: Feb. 20, 2007

(54) MULTI-LEVEL MEMORY DEVICE AND METHODS FOR PROGRAMMING AND READING THE SAME

(75) Inventors: Yi Chou Chen, Hsinchu (TW); Chih-Yuan Lu, Hsinchu (TW)

(73) Assignee: Macronix International Co., Ltd. (TW)

( * ) Notice: Subject to any disclaimer, the term of this patent is extended or adjusted under 35 U.S.C. 154(b) by 0 days.

(21) Appl. No.: 10/465,012

(22) Filed: Jun. 18, 2003

(65) Prior Publication Data

US 2004/0257854 A1 Dec. 23, 2004

(51) Int. Cl.
*G11C 11/00* (2006.01)
(52) U.S. Cl. .................................. 365/148; 365/177
(58) Field of Classification Search ............ 365/148, 365/177
See application file for complete search history.

(56) References Cited

U.S. PATENT DOCUMENTS

| | | | | |
|---|---|---|---|---|
| 3,530,441 A | | 9/1970 | Ovshinsky | |
| 5,687,112 A | * | 11/1997 | Ovshinsky | 365/163 |
| 5,912,839 A | * | 6/1999 | Ovshinsky et al. | 365/185.03 |
| 5,978,258 A | * | 11/1999 | Manning | 365/175 |
| 6,091,640 A | * | 7/2000 | Kawahara et al. | 365/185.28 |
| 6,754,107 B2 | * | 6/2004 | Khouri et al. | 365/185.23 |
| 2003/0185047 A1 | * | 10/2003 | Khouri et al. | 365/163 |
| 2004/0124503 A1 | * | 7/2004 | Harshfield | 257/622 |

OTHER PUBLICATIONS

K.F. Strauss and T. Daud, "Overview of Radiation Tolerant Unlimited Write Cycle Non-Volatile Memory," *Proc. 2000 IEEE Aerospace Conf.*, vol. 5, pp. 399-408.
S. Lai and T. Lowrey, "OUM—A 180 nm Nonvolatile Memory Cell Element Technology for Stand Alone and Embedded Applications," *IEDM Dig.* (2001), pp. 803-806.

* cited by examiner

*Primary Examiner*—Hoai V. Ho
(74) *Attorney, Agent, or Firm*—Martine Penilla & Gencarella, LLP

(57) ABSTRACT

A multilevel memory core includes a word line and a bit line. The multilevel memory core also includes a core cell in electrical communication with the word line and the bit line. The core cell includes a threshold changing material. The threshold changing material is programmed to define multiple levels for storage where each of the multiple levels for storage is associated with a corresponding threshold voltage. Methods for reading the multilevel memory core also are described.

2 Claims, 5 Drawing Sheets

MULTI-LEVEL MEMORY DEVICE AND METHODS FOR PROGRAMMING AND READING THE SAME

CROSS-REFERENCE TO RELATED APPLICATIONS

This application is related to the following applications: (1) U.S. patent application Ser. No. 10/465,120, filed on the same day as the instant application, and entitled "Method for Adjusting the Threshold Voltage of a Memory Cell"; and (2) U.S. patent application Ser. No. 10/464,938, filed on the same day as the instant application, and entitled "Transistor-Free Random Access Memory." The disclosures of these related applications are incorporated herein by reference.

BACKGROUND OF THE INVENTION

The present invention relates generally to memory devices and, more particularly, to a method of programming a threshold changing material of a memory cell to allow for multilevel data storage and associated reading techniques.

The resistance ratio of amorphous and crystalline chalcogenide is typically more than 1000 times. Due to this difference it has been proposed to separate the resistance into several stages and utilize the stages for are multi-level storage. FIG. 1 is a graph illustrating a plot of the resistance versus the current for a multi-level chalcogenide random access memory (RAM). As is illustrated by line 102, the resistance steps up according to each current increment. The resistance of chalcogenide may be tuned, however, one of the shortcomings associated with defining the stages through the resistance is that the resistance difference is difficult to sense because the sensing margin is small for multi-level applications and the sensing time for the high resistance stage will be long. For example, assuming that there are 4 states of resistance and they are 5 k, 50 k, 500 k and 5M Ohm, the current to read a cell is usually 20 µA. If we apply 0.1 V on a cell, and the cell resistance may be 5 k, 50 k, 500 k and 5M, the current read will be 20 µA, 2 µA, 0.2 µA (which can be hardly sensed), and 20 nA (the same order as noise), respectively. That is, it is almost impossible to sense all the states at that level.

In light of the foregoing, there is a need for a multi-level (multiple bits per cell) memory cell structure that includes a feature that is readily sensed for the multiple levels so that the associated states may be easily discerned.

SUMMARY OF THE INVENTION

Broadly speaking, the present invention provides a memory cell structure that is capable of defining multiple bits per cell through the use of a threshold changing material.

In accordance with one aspect of the present invention, a multilevel memory core is provided. The multilevel memory core includes a word line and a bit line. A core cell in electrical communication with the word line and the bit line is also included. The core cell includes a threshold changing material. The threshold changing material is programmed to define multiple levels for storage where each of the multiple levels for storage is associated with a corresponding threshold voltage.

In one embodiment, the threshold changing material is programmed by applying different energy pulses to the threshold changing material. In another embodiment, the voltage threshold is tuned through the application of the different energy pulses.

In accordance with another aspect of the present invention, a method for reading a multilevel memory device is provided. The method includes applying a read voltage to the multilevel memory device. Then, a state of a current associated with the read voltage is determined. Next, an access state of the multilevel memory device based on the current is determined.

In one embodiment, the multilevel memory device is programmed prior to being read. The programming includes tuning a voltage threshold through the application of varying energy pulses.

In accordance with yet another aspect of the present invention, a method for reading multiple levels of a multi-level memory device is provided. The method initiates with applying a voltage to a threshold changing material of the multilevel memory device. Then, a current related to the voltage is sensed to distinguish between each of the multiple levels.

It will be apparent to those skilled in the art that the method of reading the multilevel memory device of the present invention may be applied in numerous memory/solid state device applications. One of the significant advantages of the read method is the speed and the sensing margin achieved when reading the current as opposed to sensing resistance.

It is to be understood that the foregoing general description and the following detailed description are exemplary and explanatory only and are not restrictive of the invention, as claimed.

BRIEF DESCRIPTION OF THE DRAWINGS

The accompanying drawings, which are incorporated in and constitute part of this specification, illustrate exemplary embodiments of the invention and together with the description serve to explain the principles of the invention.

DETAILED DESCRIPTION OF EXEMPLARY EMBODIMENTS

Figure 1:
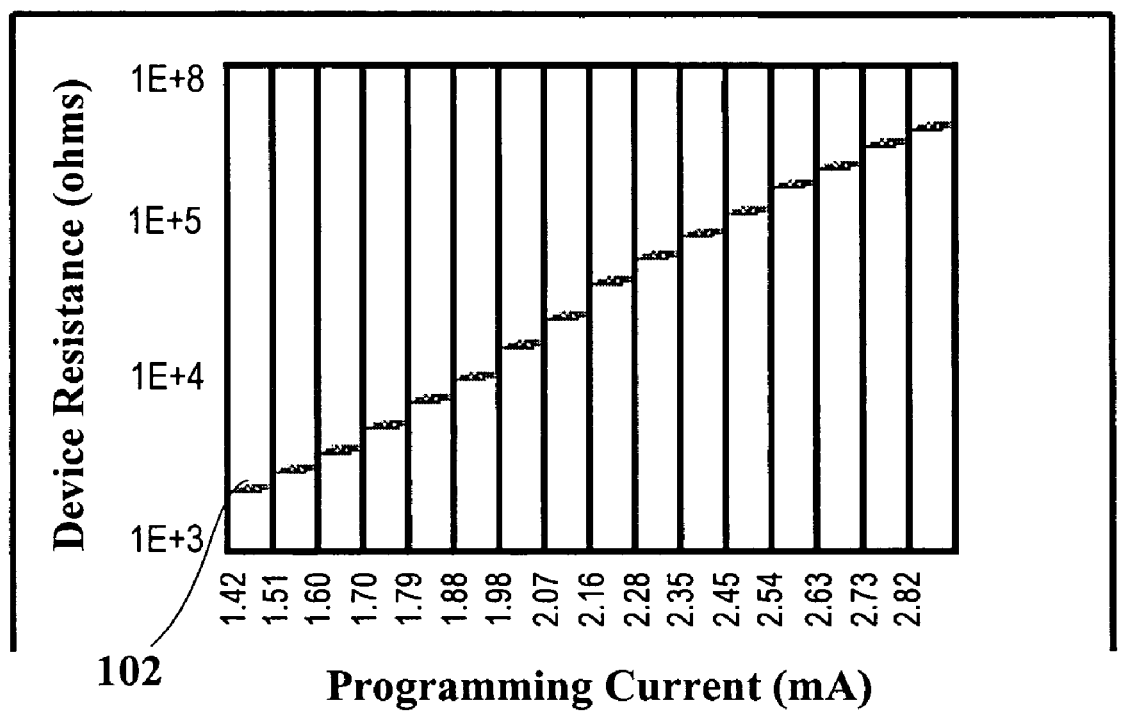
FIG. 1 is a graph illustrating a plot of the resistance versus the current for a multi-level chalcogenide random access memory (RAM).

Several exemplary embodiments of the invention will now be described in detail with reference to the accompanying drawings. FIG. 1 has been described above in the "Background of the Invention" section.

In accordance with the present invention, a threshold voltage associated with a threshold changing material is obtained by applying different energy pulses in order to define different threshold voltages. In one embodiment, the threshold changing material is a chalcogenide material. Further information on adjusting the threshold voltage, $V_{th}$, of a material capable of changing $V_{th}$ is discussed in related U.S. patent application Ser. No. 10/465,120, filed on even date herewith, and entitled "Method for Adjusting the Threshold Voltage for a Memory Cell." The disclosure of this related application is incorporated herein by reference for all purposes. Above the threshold voltage, the current associated with each stage is distinguishable. Consequently, by sensing the current, the corresponding states may be determined. Therefore, within one memory core cell multiple states may exist and the different states correspond to a sensed current.

Figure 2:
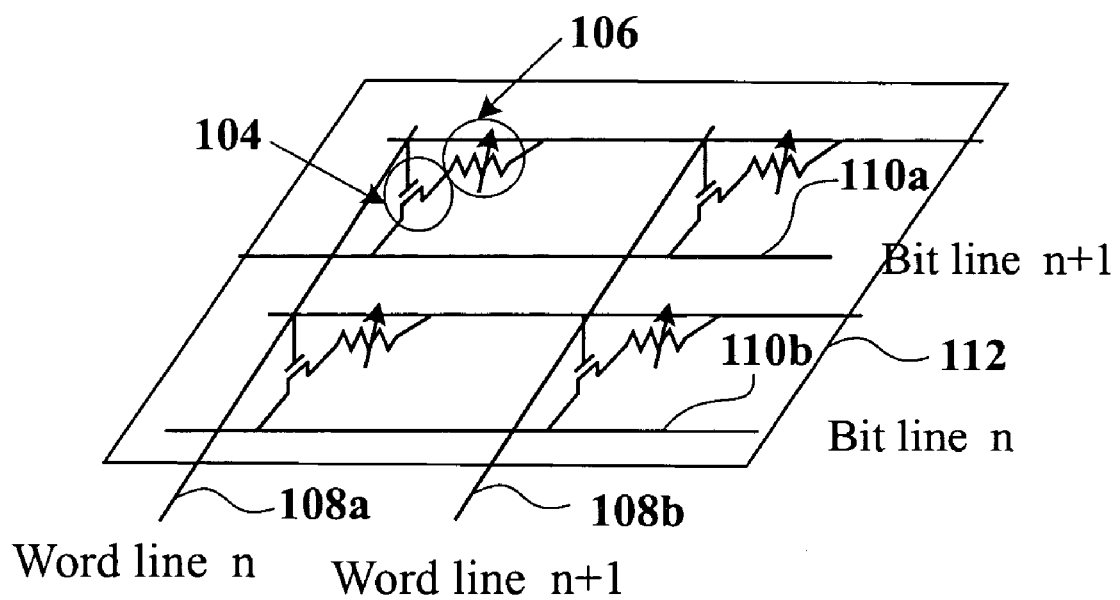
FIG. 2 is a simplified schematic diagram of a portion of a typical chalcogenide memory array.

FIG. 2 is a simplified schematic diagram of a portion of a typical chalcogenide memory array. Memory array portion 112 includes word lines 108a and 108b, bit lines 110a and 110b, transistor device 104, and chalcogenide device 106. Transistor device 104 functions as a steering device, i.e., an access transistor, which provides access to chalcogenide device 106 from the corresponding word line and bit line. By way of example, transistor device 104 may by an access P-N diode, a bipolar junction transistor (BJT), or other suitable transistor. It should be appreciated that chalcogenide device 106 functions as a memory device.

Figure 3:
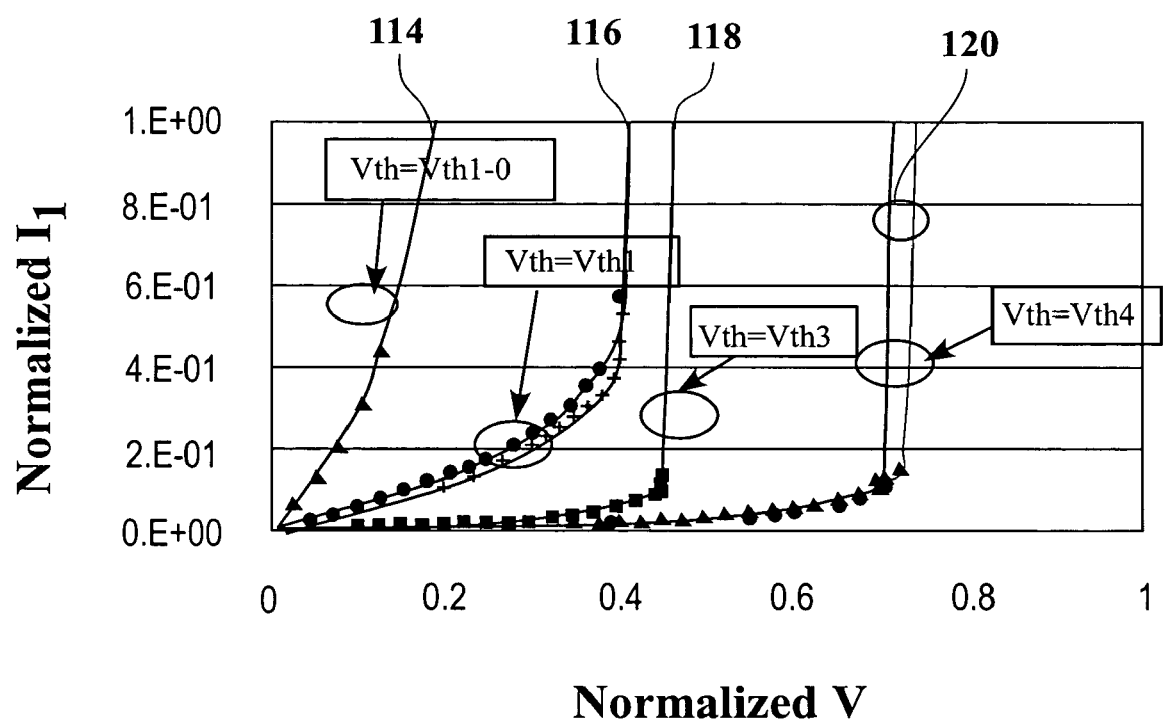
FIG. 3 is a normalized current (I)-normalized voltage (V) curve where different programming pulses were applied to applied to a threshold changing material in order to define different threshold voltages.

FIG. 3 is a normalized current (I)-normalized voltage (V) curve where different programming pulses were applied to applied to a threshold changing material in order to define different threshold voltages. As described in the above-mentioned related application (U.S. patent application Ser. No. 10/465,120), the $V_{th}$ of chalcogenide may be adjusted by applying energy into the film. Therefore, there may be different $V_{th}$ within a single memory core cell. To program a cell, the steering transistor of the selected cell may be activated and a certain energy pulse is applied to the cell. The energy pulse is associated with a certain duration and profile. For example, to program a cell a voltage from 0.1 V to 20 V may be applied. In one embodiment, the duration may be 1 nanosecond (ns) to 1000 ns. One skilled in the art will appreciate that different programming pulses result in different $V_{th}$. The various states illustrated in FIG. 3 are associated with the four threshold voltages ($V_{th}$). That is, $V_{th1}$ is associated with a first state, $V_{th2}$ is associated with a second state, $V_{th3}$ is associated with a third state, and $V_{th4}$ is associated with a fourth state.

Table 1 below provides a truth table associated with the four states illustrated in FIG. 3. As can be seen, state 1 is defined when the read voltage $V_a$ is between $V_{th1}$ and $V_{th2}$. States 1 and 2 are defined when the read voltage $V_b$ is between $V_{th2}$ and $V_{th3}$. States 1, 2, and 3 are defined when the read voltage $V_c$ is between $V_{th3}$ and $V_{th4}$. States 1, 2, 3, and 4 are defined when the read voltage $V_d$ is greater than $V_{th4}$.

TABLE 1

| State | 1 | 2 | 3 | 4 |
|---|---|---|---|---|
| Read Voltage\$V_{th}$ | $V_{th1}$ | $V_{th2}$ | $V_{th4}$ | $V_{th3}$ |
| $V_{th1} < V_a < V_{th2}$ | On | Off | Off | Off |
| $V_{th2} < V_b < V_{th3}$ | On | On | Off | Off |
| $V_{th3} < V_c < V_{th4}$ | On | On | On | Off |
| $V_{th4} < V_d$ | On | On | On | On |

Figure 4:
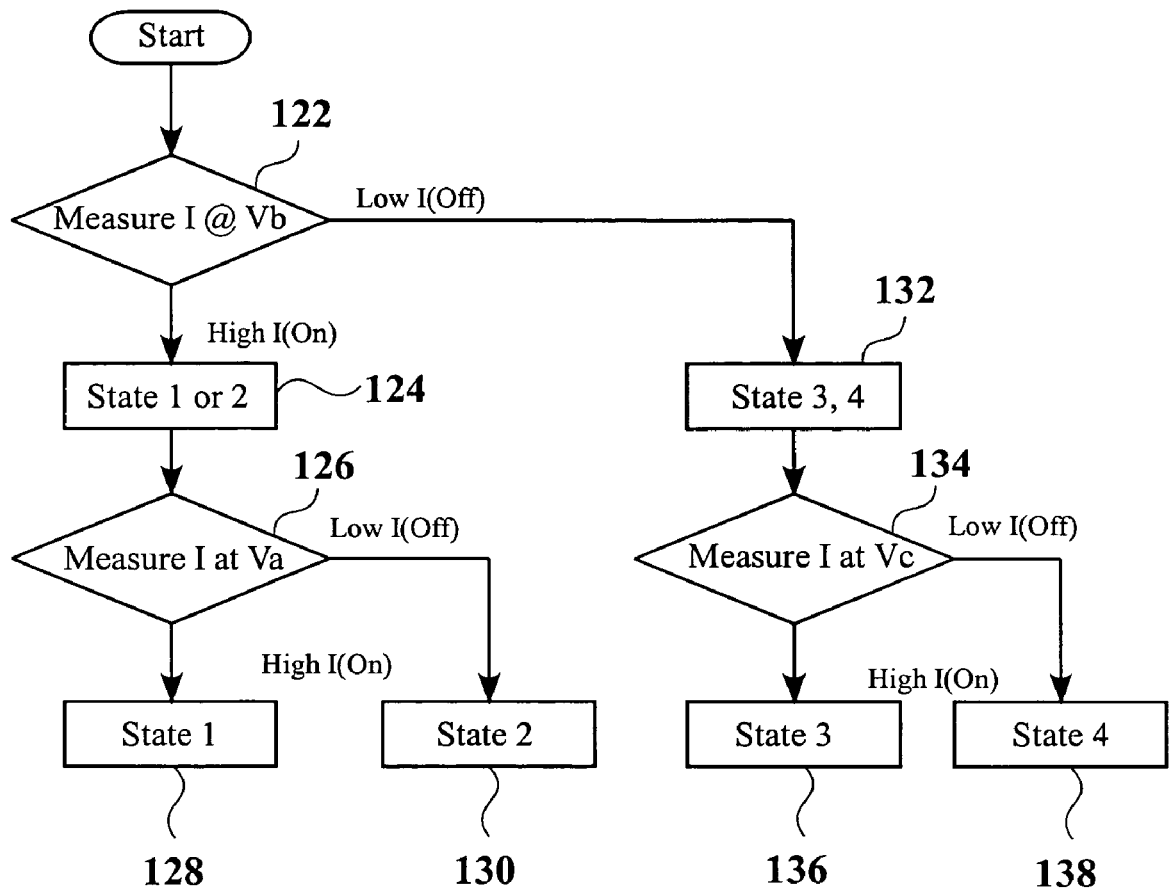
FIG. 4 is a flow chart diagram illustrating the method operations for reading the multi-level states associated with a threshold changing material.

FIG. 4 is a flow chart diagram illustrating the method operations for reading the multi-level states associated with a threshold changing material. The method initiates with decision operation 122 where a current is measured at read voltage $V_b$. If the current is high (on), then the method advances to operation 124 where the state is either state one or state two. The method then moves to decision operation 126 where the current is measured at read voltage $V_a$. If the current is high (on), then the associated state is state one as indicated in box 128. If the current measured in decision operation 126 is low (off), then this is an indication of state two 130. Returning to decision operation 122, if the current measured at $V_b$ is low (off), then this is an indication of either state three or four as represented by box 132. The method then proceeds to decision operation 134 where the current is measured at voltage $V_c$. If the current measured at $V_c$ is high (on), then this is an indication of state three 136. If the current measured at $V_c$ is low (off), then the associated state here is state four as represented by box 138.

Figure 5:
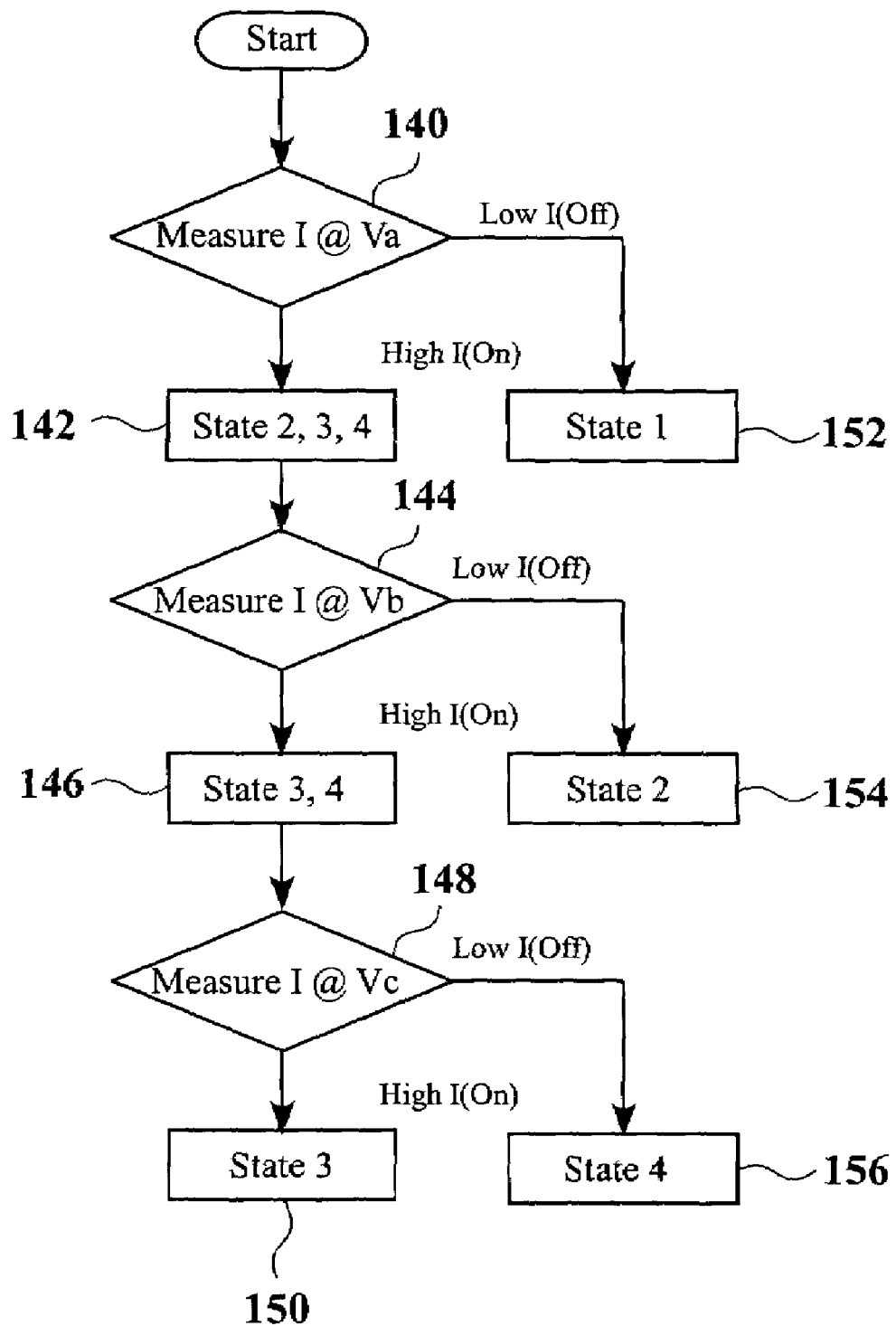
FIG. 5 is flowchart diagram representing an alternative method for reading the multi-level states of a threshold changing material described with reference to FIG. 4.

FIG. 5 is a flowchart diagram of an alternative method for reading the multi-level states of a threshold changing material described with reference to FIG. 4. The method initiates with a decision operation 140 where a current is measured at voltage $V_a$. If the current associated with read voltage $V_a$ indicates high (on), then the method proceeds to operation 142 which indicates that the state is either state two, three or four. The method then proceeds to decision operation 144 where the current is measured at read voltage $V_b$. If the current associated with $V_b$ is high (on), this indicates either state three or state four in box 146. The method then moves to decision operation 148 where the current is measured at voltage $V_c$. If the voltage at $V_c$ is high (on), then state three is indicated as provided by box 150. If the current measured in decision operation 148 indicates low (off), then this represents state four, box 156. If the current measured in decision operation 144 at $V_b$ indicates low (off), then state two has been identified as represented by box 154. Returning to decision operation 140, if the current measured at $V_a$ is low (off), then state one, box 152 has been achieved.

In summary, a multi-level chalcogenide memory is described herein. The multi-level data are stored according to different threshold voltages. In one embodiment, the threshold voltage is tuned by applying different energy pulses (further information on applying different energy pulses to tune the threshold voltage has been incorporated herein by reference). Additionally, two reading methods have been discussed. It should be appreciated in each of the reading methods the reading voltage should be higher than the threshold voltage. Accordingly, by changing the threshold voltage of the threshold changing material, a multi-level memory is provided. As discussed above, a multi-level non-volatile random access memory may be achieved in one embodiment of the invention. Since the reading sensing margin is very large, as opposed to a resistance-based model, the multi-level stages may be easily discerned. Reading the current suffices to provide a distinguishing feature. Furthermore, the reading speed is relatively fast as compared to other reading speeds, i.e., the speed associated with reading resistance.

The invention has been described herein in terms of several exemplary embodiments. Other embodiments of the invention will be apparent to those skilled in the art from consideration of the specification and practice of the invention. The embodiments and preferred features described above should be considered exemplary, with the scope of the invention being defined by the appended claims and their equivalents.

The inventon claimed is:

1. A method for reading multiple levels of a multilevel memory device, comprising:
    applying a voltage to a threshold changing chalcogenide material of the multilevel memory device;
    sensing a current related to the voltage to distinguish between each of the multiple levels and to read a state, the state associated with each of the multiple levels being maintained after the applying of the voltage and the sensing of the current related to the voltage;
    without reprogramming of the multilevel memory device, applying an other voltage;
    sensing a current related to the other voltage; and
    calculating a current difference.

2. The method of claim 1, wherein the current difference is a difference between the current related to the voltage and the current related to the other voltage.

* * * * *